United States Patent [19]

Swirhun et al.

[11] Patent Number: 5,412,680
[45] Date of Patent: May 2, 1995

[54] LINEAR POLARIZATION OF SEMICONDUCTOR LASER

[75] Inventors: Stanley E. Swirhun, Boulder; Thomas J. O'Neill, Jr., Superior, both of Colo.

[73] Assignee: Photonics Research Incorporated, Bloomfield, Colo.

[21] Appl. No.: 210,526

[22] Filed: Mar. 18, 1994

[51] Int. Cl.$^6$ ............................................. H01S 3/19
[52] U.S. Cl. .................................. 372/45; 372/46; 372/96; 372/27; 372/50
[58] Field of Search ................... 372/45, 46, 96, 27, 372/99, 50, 47

[56] References Cited

U.S. PATENT DOCUMENTS

| | | | |
|---|---|---|---|
| 4,949,351 | 8/1990 | Imanaka | 372/46 |
| 5,063,569 | 11/1991 | Xie | 372/45 |
| 5,115,442 | 5/1992 | Lee et al. | 372/45 |
| 5,245,622 | 9/1993 | Jewell et al. | 372/45 |
| 5,325,386 | 6/1994 | Jewell et al. | 372/50 |
| 5,331,654 | 7/1994 | Jewell et al. | 372/45 |

FOREIGN PATENT DOCUMENTS 0011779 1/1991 Japan .................. 372/47

*Primary Examiner*—Georgia Y. Epps
*Attorney, Agent, or Firm*—Fisher & Associates

[57] ABSTRACT

This invention discloses vertical cavity surface emitting lasers (VCSELs) formed to emit optical radiation that has a controlled direction of polarization. In one embodiment, a VCSEL has an active region that contains at least one strained semiconductor layer which has a preferred direction of electrical conductivity due to the strain. As a result, the optical radiation emitted from the VCSEL has a direction of polarization that is parallel to the preferred direction of conductivity. In another embodiment, a VCSEL has an elongated active region, and the direction of polarization of the radiation emitted from the VCSEL is parallel to a longitudinal axis of the active region. The invention also discloses a VCSEL array comprising vertical cavity surface emitting lasers having elongated active regions. By forming the elongated active regions parallel to each other, the array emits optical radiation having parallel polarization. Alternatively, the array may be formed so that the elongated active regions of adjacent VCSELs of the array are perpendicular to each other. As a result, adjacent VCSELs in the array emit optical radiation having orthogonal polarizations.

19 Claims, 7 Drawing Sheets

LINEAR POLARIZATION OF SEMICONDUCTOR LASER

FIELD OF THE INVENTION

This invention relates to semiconductor lasers and, more particularly, relates to vertical cavity surface emitting lasers that emit optical radiation having the fundamental transverse mode and controlled polarizations.

BACKGROUND OF THE INVENTION

Semiconductor lasers are widely used in applications such as optical communications, optical disk players, etc. A typical semiconductor laser contains an active region disposed between two parallel mirrors which form therebetween an optical cavity. When an electrical current is applied, the active region generates optical radiation which is reflected back and forth between the mirrors before it is emitted. When the applied current is greater than a threshold current of the laser, the optical radiation in the optical cavity coherently oscillates to form a standing wave. As a result, the laser emits coherent optical radiation.

The optical radiation emitted from the laser may have different spatial distributions. If a laser emits optical radiation that contains only the fundamental transverse mode, the radiation is a narrow laser beam with a Gaussian-distributed cross-section, most intense in the center and less intense at the edges. In contrast, laser radiation having a higher transverse mode displays bright and dark spots across the cross-section of the radiation. The transverse modes are conventionally designated as $TEM_{00}$, $TEM_{01}$, $TEM_{10}$, $TEM_{11}$, etc. where $TEM_{00}$ is the fundamental transverse mode and the others are higher transverse modes.

Radiation with higher transverse modes is normally undesirable because it is difficult to couple such radiation into optical fibers and to focus it for free-space beam forming. In addition, higher transverse mode radiation travels at somewhat slower speed in an optical fiber than the fundamental transverse mode radiation, thereby creating mode dispersion, i.e., broadening of an optical pulse as it travels in an optical fiber.

In a vertical cavity surface emitting laser (VCSEL), the mirrors that form the optical cavity are parallel to a substrate on which the laser is formed. Thus, the optical cavity of a VCSEL is perpendicular to the substrate; and optical radiation is emitted from the VCSEL in a direction normal to the substrate.

VCSELs have many advantages over conventional edge emitting lasers. For example, VCSELs can be made extremely small; VCSELs can easily be made into arrays that contain a large number of VCSELs; and VCSELs can be readily integrated monolithically with other semiconductor devices.

However, currently available VCSELs have several problems. One problem relates to higher transverse mode lasing. A typical circular shaped VCSEL with a diameter greater than 10 $\mu$m emits $TEM_{00}$ mode radiation only at low current. At high current, the VCSEL emits higher transverse mode radiation.

Second, unlike edge emitting lasers, available VCSELs emit radiation having uncontrolled directions of polarization. In many applications (e.g. magneto-optical disks), lasers having controlled directions of polarization are highly desirable.

Third, currently available VCSEL arrays cannot be made to emit laser beams, each of which has a predetermined orientation of polarization. Adjacent VCSELs in a VCSEL array have a tendency to couple with each other. In some instances, this results in unwanted beam cross sections. It could be prevented if it were possible to control the direction of polarization of adjacent VCSELs since adjacent VCSELs that have perpendicular polarizations usually couple weakly. In other instances, it may be desirable to control the directions of polarization of the VCSELs so that they all have the same direction of polarizations, i.e., have parallel polarizations.

It is therefore an object of the present invention to provide a semiconductor laser that emits optical radiation having a controlled direction of polarization.

It is another object of the present invention to provide a semiconductor laser that emits optical radiation in substantially the fundamental $TEM_{00}$ mode.

It is yet another object of the present invention to provide a VCSEL array in which the directions of polarizations of adjacent VCSELs can be predetermined.

SUMMARY OF THE INVENTION

In one embodiment of the invention, the active region comprises at least one strained semiconductor layer. The strained semiconductor layer has a preferred direction of conductivity which is substantially along a first direction parallel to the mirrors. As a result, the laser emits optical radiation having a direction of polarization that is substantially parallel to the first direction.

In another embodiment, an elongated active region is formed between the mirrors. The elongated active region has longitudinal and transverse axes oriented in directions substantially perpendicular to the direction of optical radiation. The dimension of the active region along the transverse axis is sufficiently small so that the laser emits optical radiation having substantially a fundamental transverse mode along the transverse axis. In addition, the optical radiation emitted from this laser has a controlled direction of polarization that is substantially parallel to the longitudinal axis.

In another embodiment, a vertical cavity surface emitting laser array is disclosed comprising a plurality of vertical cavity surface emitting lasers integrally formed on a substrate. Each of the lasers comprises an elongated active region having longitudinal and transverse axes; and the dimension of the active region along the transverse axis being sufficiently small so that each laser emits optical radiation having substantially a fundamental mode along the transverse axis and a direction of polarization that is substantially parallel to the longitudinal axis. Thus, by forming the array wherein each elongated active region is parallel to all the other elongated active regions, the direction of polarization of the optical radiation from each laser is parallel to that of all the other lasers. Alternatively, by forming the array wherein any two adjacent lasers have elongated active regions perpendicular to each other, each laser emits optical radiation having a direction of polarization that is perpendicular to the direction of polarization of the optical radiation emitted from any adjacent laser.

BRIEF DESCRIPTION OF THE DRAWINGS

These and other objects, features and advantages of the invention will be more apparent from the following detailed description in conjunction with the appended drawings in which:

FIGS. 1 (a)-(b) illustrate cross-sectional views of a VCSEL that emits linear polarized optical radiation;

FIG. 1 (c) illustrates a top view of a wafer containing the structure of FIGS. 1 (a)-(b);

FIGS. 2 (a)-(c) depict a top view and longitudinal and transverse cross-sections of a VCSEL that has an elongated active region;

FIGS. 3 (a)-(c) depict a top view and longitudinal and transverse cross-sections of a VCSEL that has an elongated active region and etched trenches;

FIGS. 4 (a)-(b) depict a top view and a cross-sectional view of a VCSEL that has an elongated active region and implanted regions for suppressing higher mode radiation;

DETAILED DESCRIPTION

In a first embodiment of the invention, a VCSEL is formed having an active region that contains at least one strained semiconductor layer. The strained semiconductor layer displays an electrical conduction anisotropy due to the strain and has a preferred direction of electrical conductivity substantially along a first direction. As a result, the VCSEL emits an optical radiation having a direction of polarization that is substantially parallel to the first direction.

Figure 1A:
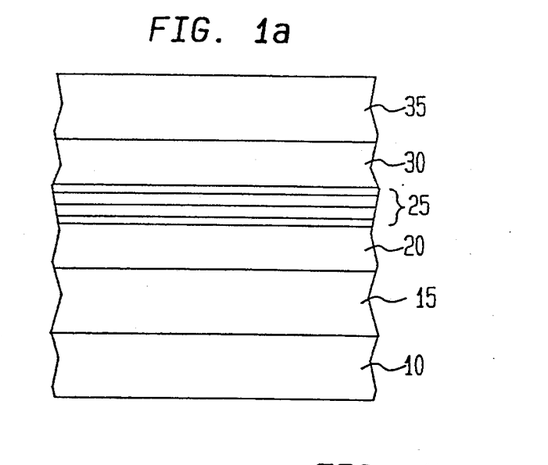

FIG. 1 (a) depicts a cross-section of a preferred embodiment of the invention. Illustratively, the VCSEL comprises a GaAs substrate 10 which has a crystal orientation conventionally designated as (100), a first mirror 15, a first spacer 20, an active region 25, a second spacer 30, and a second mirror 35. The active region includes at least one quantum well. The quantum well comprises a first semiconductor layer interposed between second and third semiconductor layers. Normally, the second and third semiconductor layers have greater energy bandgaps than the first semiconductor layer.

Figure 1B:
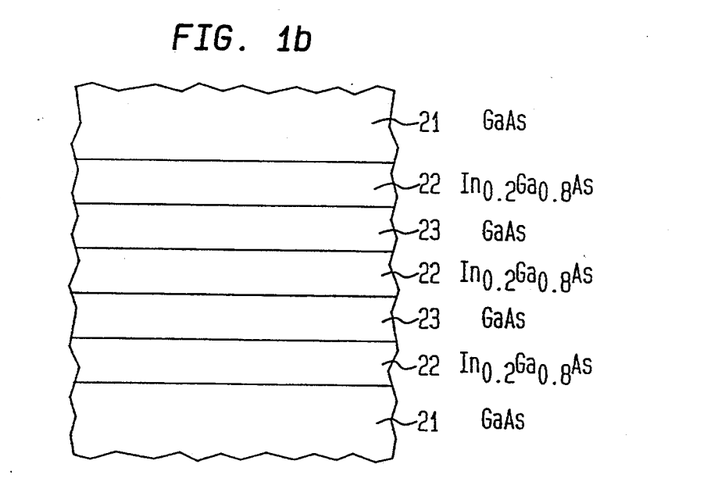

FIG. 1 (b) is a more detailed illustration of the cross-section of the active region 25. For purposes of illustration, the active region comprises three $In_{0.2}Ga_{0.8}As$ layers 22 separated by GaAs layers 21. Thus, the active region contains three $In_{0.2}Ga_{0.8}As$ quantum wells. Preferably, each of GaAs layers 23 is about 100Å thick. The outermost GaAs layers contact AlGaAs spacers 20 and 30.

In the quantum wells of the preferred embodiment, the thickness of the $In_{0.2}Ga_{0.8}As$ layers are judiciously chosen in order to maximize the conduction anisotropy that results in a preferred direction of conduction substantially along a first direction. In the InGaAs quantum well, there exists tensile strain in the GaAs layers and compressive strain in the InGaAs layers because bulk InGaAs has a greater lattice constant than bulk GaAs. Additionally, the strain in the InGaAs layer increases as the thickness of the InGaAs layer increases. Advantageously, the strain in the InGaAs layer produces an electrical conduction anisotropy which results in a preferred direction of conduction substantially along a conventional crystal lattice direction [110]. Consequently, when an electrical current is applied to the VCSEL, the current prefers to flow along the [110] direction in the active region. As a result, the VCSEL emits optical radiation having a direction of polarization substantially along the crystal direction [110].

To maximize the strain and thus the polarization along the [110] direction, the thickness of the InGaAs layer may be maximized. However, there are other factors that need to be considered. First, the wavelength of the optical radiation emitted from the VCSEL depends on the composition as well as the thickness of the InGaAs layer. Thus, changing the thickness of the InGaAs layer changes the wavelength of the radiation. Second, if the thickness of the InGaAs layers becomes greater than a critical thickness, dislocations arise in the InGaAs layers. The critical thickness depends on the composition of the layers. In the preferred embodiment, the number of dislocations in the $In_{0.2}Ga_{0.8}As$ layer becomes substantial when the thickness of the $In_{0.2}Ga_{0.8}As$ layer exceeds approximately 190Å. If the thickness of each of the $In_{0.2}Ga_{0.8}As$ layers is between approximately 190Å and 300Å, dislocations in the $In_{0.2}Ga_{0.8}As$ layers are preferentially formed substantially along the conventional crystal lattice direction [110]. When the thickness of the $In_{0.2}Ga_{0.8}As$ layer exceeds 300Å, defects along both the [110] and [−110] directions are likely to occur.

Figure 1C:
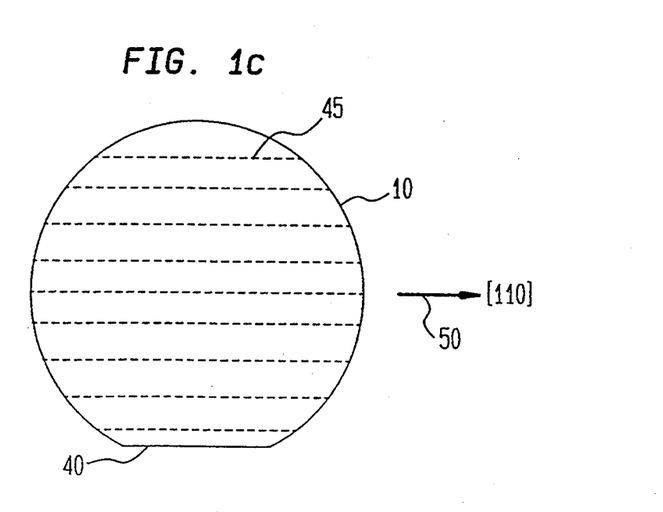

FIG. 1 (c) illustrates a top view of such laser structure epitaxially grown on (100) GaAs substrate 10. Illustratively, substrate 10 is a commercially available (100) GaAs substrate having a major orientation flat 40. This major orientation flat is parallel to the [110] direction. In this figure, dashed lines 45 indicates the preferred direction of conduction in the $In_{0.2}Ga_{0.8}As$ quantum wells.

In another embodiment of the invention, a VCSEL has an elongated active region which has longitudinal and transverse axes oriented in directions substantially perpendicular to the direction of the optical radiation emitted from the VCSEL. Advantageously, the dimension of the active region along the transverse axis is sufficiently small that the mode of the optical radiation along the transverse axis is the fundamental mode. Additionally, the emitted radiation also has a controlled direction of polarization that is substantially parallel to the longitudinal axis of the elongated active region.

Figure 2A:
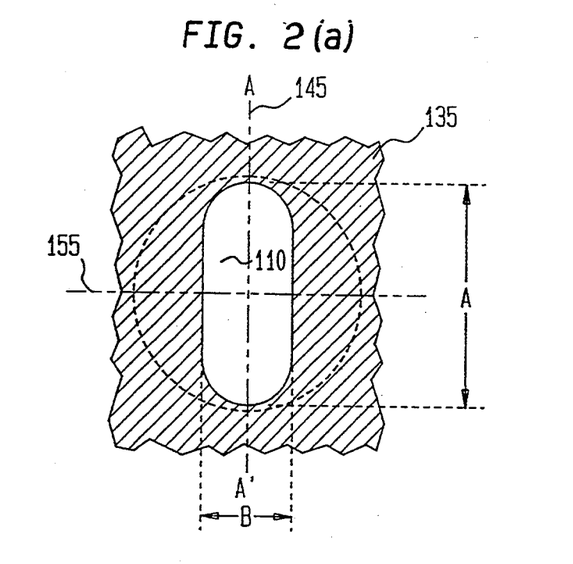
Figure 2B:
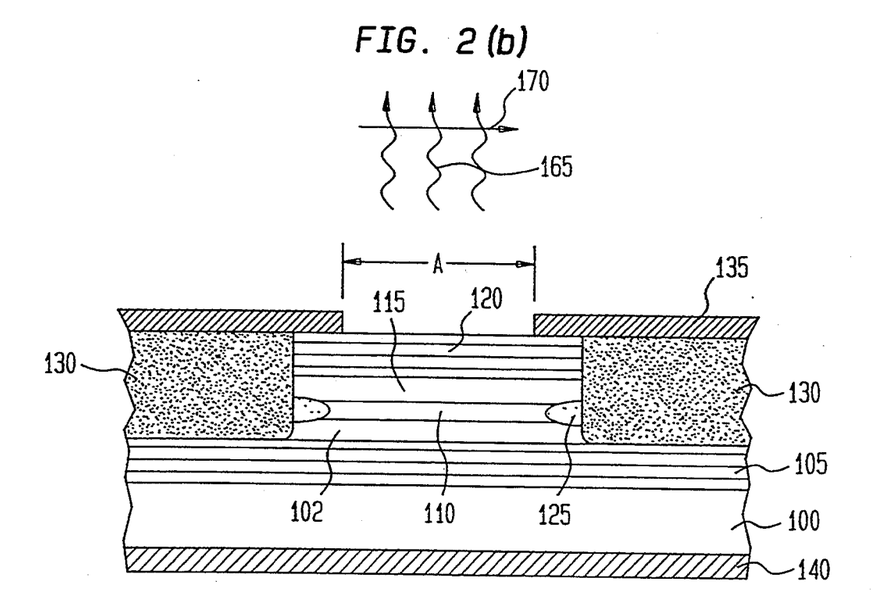
Figure 2C:
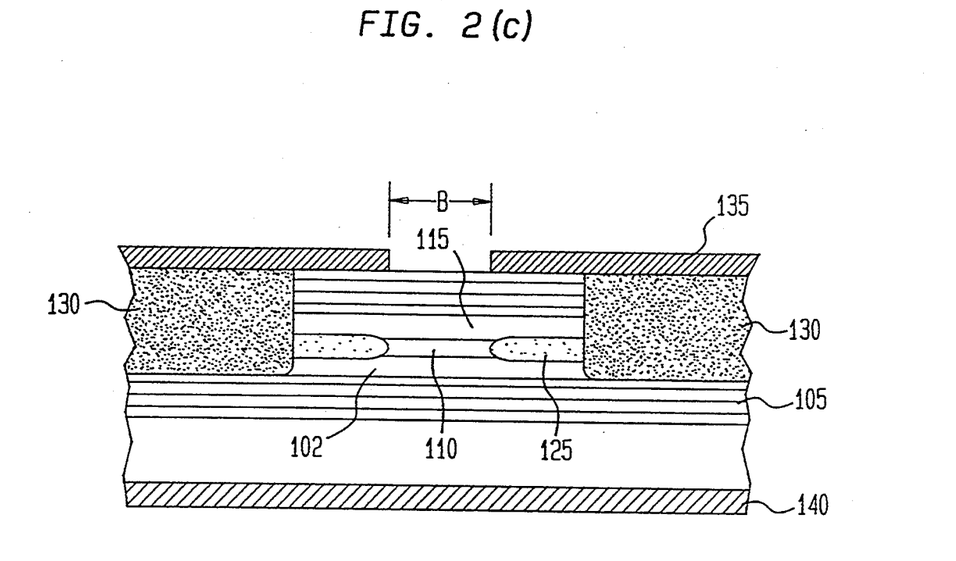

FIGS. 2(a)-(c) illustrate a top view, a cross-sectional view along the longitudinal axis A—A' of active region, and a cross-sectional view along the transverse axis B—B' of the active region, respectively, of a preferred embodiment of the VCSEL.

As shown in FIGS. 2 (b) and (c), the VCSEL comprises a substrate 100, a first mirror 105, a first spacer 102, an oval-shaped active region 110, a second spacer 115, and a second mirror 120. Additionally, the VCSEL also includes a current confinement region 125 which laterally surrounds the active region, and an isolation region 130. Two contacts, substrate contact 140 and top contact 135, are also formed.

As shown in FIG. 2 (a), oval active region 110 has a longitudinal axis 145 and a transverse axis 155. Illustratively, the dimensions of the active region along the longitudinal and transverse axes are labelled A and B, respectively.

Preferably, transverse dimension B is less than 6 μm, so that the transverse mode of optical radiation 165 along the transverse axis is substantially at the fundamental mode. The dimension of the active region along the longitudinal axis is approximately 20 μm. Optical radiation 165 has a direction of polarization substantially parallel to longitudinal axis 145. This linear polarization is illustratively shown in FIG. 2 (b) as 170.

In this VCSEL, mirrors 105 and 120 are semiconductor distributed Bragg reflectors comprising a plurality of alternating semiconductor layers of high and low indices of refraction, and each layer is λ/4n thick where λ is the free-space wavelength of the radiation and n is the index of refraction of the layer. If the substrate is an n-type substrate, the first mirror is doped to have an n-type conductivity, and the second mirror is doped to have a p-type conductivity.

Current confinement region 125 is formed by implanting conductivity reducing ions such as Ar, He, H, or O into the region surrounding the active region. Similarly, an isolation region 130 is formed by a deep implantation of one of these ions.

The fabrication of this VCSEL is similar to the fabrication of a conventional VCSEL which is well known to those skilled in the art, and thus is not described in detail here.

Figure 3A:
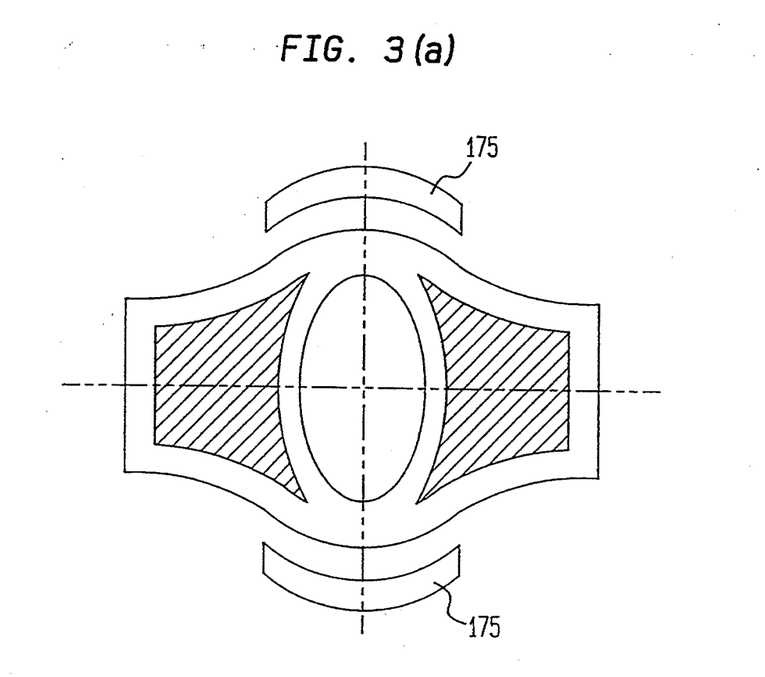
Figure 3B:
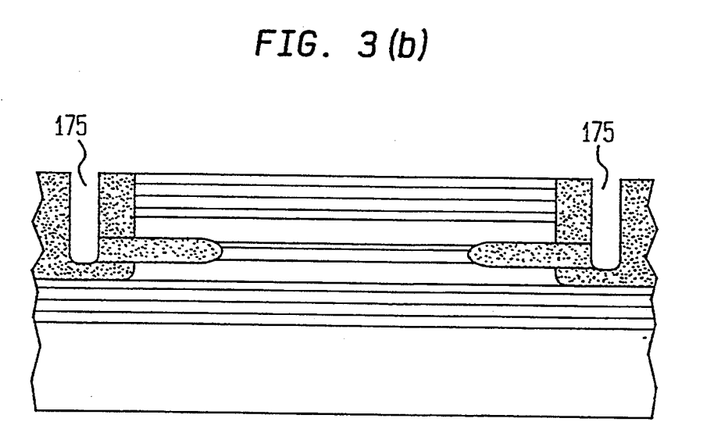
Figure 3C:
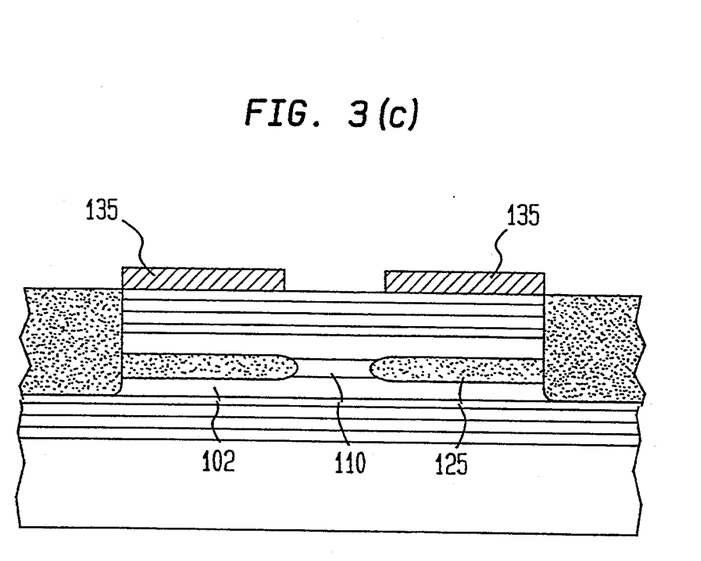
Figure 4A:
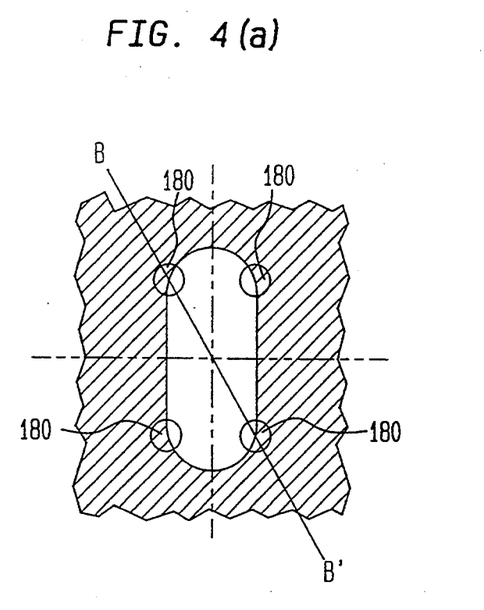
Figure 4B:
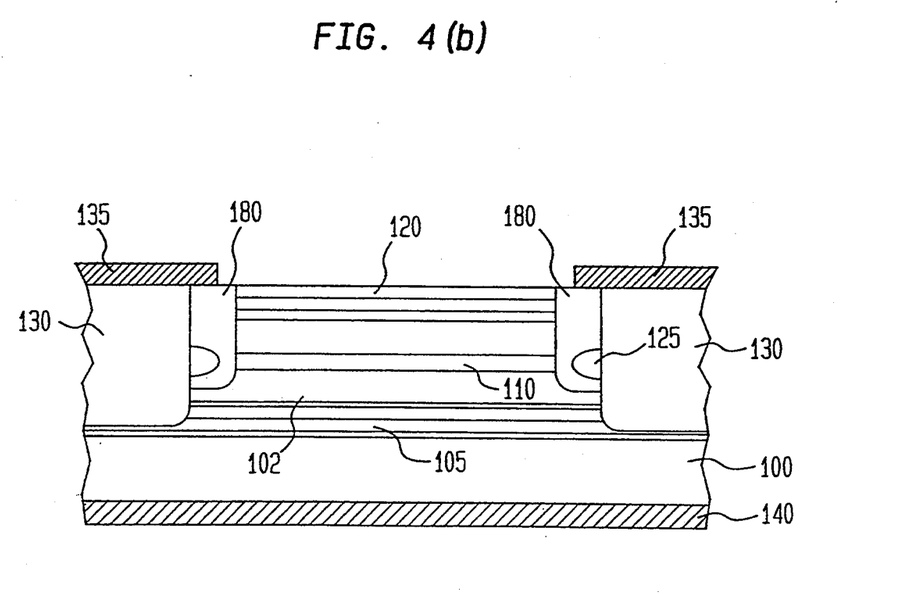
Figure 5:
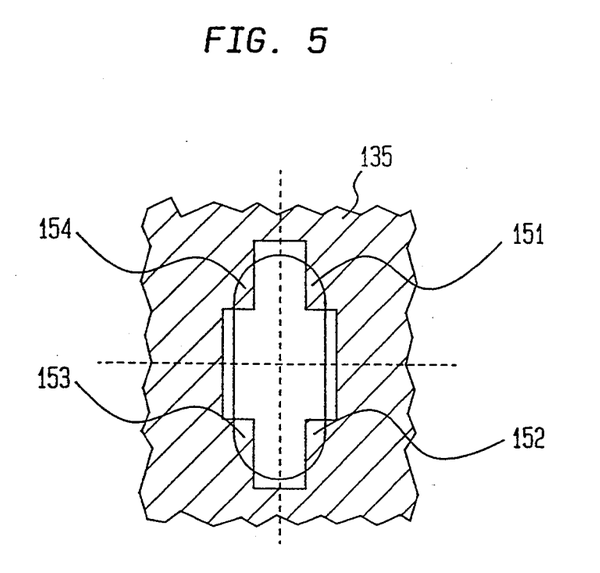
FIG. 5 depicts a top view of a VCSEL that has an elongated active region and a contact layer having a cross-shaped aperture.

Other embodiments of VCSELs based on the above-described VCSEL are disclosed below. These VCSELs are developed to suppress the higher transverse modes along the longitudinal axis of the active region in order to achieve lasing at only the fundamental transverse mode, i.e. $TEM_{00}$ mode. In FIGS. 3-5 and in the following description, for convenience of reference, like elements have been given the same reference designation as in FIGS. 2 (a)-(c).

In the embodiment depicted in FIGS. 3(a)-(c), in addition to an oval active region 110 lasing., a current confinement region 125, and an isolation region 130, a VCSEL further includes two etched trenches 175 formed at two longitudinal ends of the VCSEL. Each of the trenches vertically extends from the top of the second mirror region through the active region. Advantageously, the trenches limit the current flowing toward the longitudinal ends and, therefore suppress higher transverse mode lasing along the longitudinal direction. Judicious uses of trenches or mesa lead to a conduction anisotropy which is utilized to suppress higher mode lasing. The trenches can also be used for combined "index guiding" and "gain guiding." Such trenches can be formed by wet chemical etching, reactive-ion etching, or other well-developed etching techniques.

FIG. 4 (a) illustrates a top-view of another embodiment. Based on the device described in FIG. 2(a)-(c), this VCSEL further includes four implanted regions 180 distributed at the periphery of the active region and symmetrically to both the longitudinal and transverse axes.

FIG. 4(b) depicts a cross-sectional view of the VCSEL along axis BB' shown in FIG. 4 (a). Illustratively, each of the implanted regions is circularly shaped, and vertically extends from the top of the VCSEL through the active region. Implantation regions 180 are formed by the implantation of conductivity-reducing ions such as Ar, He, H, or O. The implantation eliminates lasing in these implanted regions, thereby suppressing higher transverse mode lasing along the longitudinal axis.

In the embodiment depicted in the top view of FIG. 5, the VCSEL has the same structure as the VCSEL shown in FIG. 2(a)-(c) except that contact layer 135 has a cross-shaped aperture having longitudinal and transverse axes. The aperture is vertically aligned to the oval active region such that the longitudinal and transverse axes of the aperture are respectively aligned to the longitudinal and transverse axes of the active region. Additionally, the contact layer overlaps the active region at four locations 151, 152, 153, 154 symmetric to both the longitudinal and transverse axes of the active region. As a result, the overlapped regions do not generate optical radiation during lasing. Advantageously, this VCSEL emits optical radiation having substantially the fundamental transverse mode, i.e. $TEM_{00}$. In addition, the emitted optical radiation has a direction of polarization parallel to the longitudinal axis of the active region.

Figure 6:
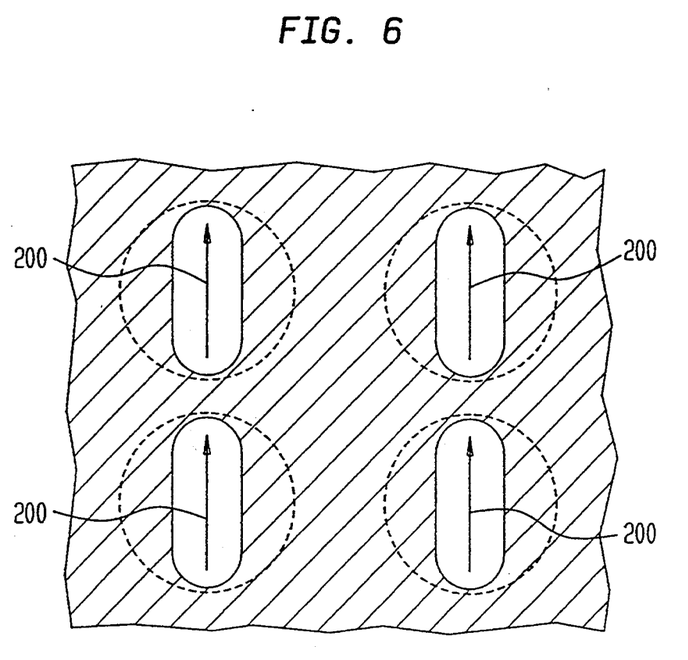
FIG. 6 depicts a top view of a VCSEL array in which the optical radiation from each VCSEL is linearly polarized in the same direction.

FIG. 6 illustrates a top view of a monolithically integrated VCSEL array. In this array, each VCSEL has an elongated active region having longitudinal and transverse axes. The VCSELs are formed in a way that their longitudinal axes are all substantially parallel to each other. Thus, each VCSEL emits optical radiation that has a direction of polarization 200 parallel to the longitudinal axis of the active region. As a result, each of the VCSELs from the array emits optical radiation having a direction of polarization that is parallel to the polarization of every other VCSEL of the array.

Illustratively, each of the VCSELs in the array shown in FIG. 6 is substantially similar to the VCSELs shown in FIGS. 2 (a)-(c). Alternatively, VCSELs such as those shown in FIG. 3 (a)-(c) or FIGS. 4 (a)-(b) can also be utilized to form the array.

Figure 7:
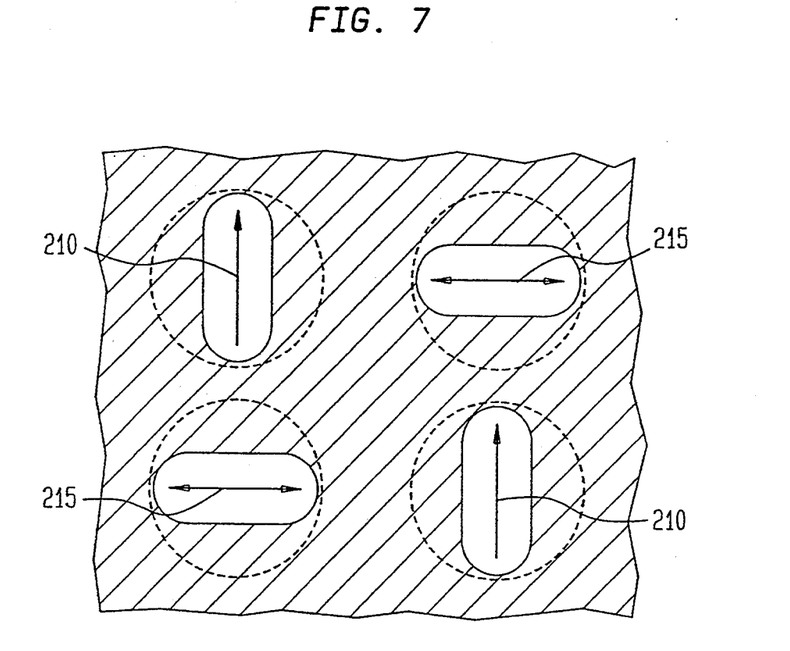
FIG. 7 depicts a top view of a VCSEL array in which the optical radiation from each VCSEL is linearly polarized and is at right angles to that of adjacent VCSELs.

FIG. 7 depicts a top view of another VCSEL array. In this array, each VCSEL emits optical radiation having a direction of polarization 210 or 215 perpendicular to the direction of polarization 215 or 210 of the adjacent VCSELs.

In particular, each of the VCSELs that form the array has an elongated active region. However, the direction of the longitudinal axes of the VCSELs alternates so that the direction of the longitudinal axis of each VCSEL is at right angles to that of its adjacent VCSELs both above and below it and to the left and right in the array. The optical radiation emitted from each VCSEL has a direction of polarization along the longitudinal axis of the VCSEL. As the result, radiation emitted from any VCSEL has a direction of polarization perpendicular to the direction of polarization of its four adjacent VCSELs.

Illustratively, each of the VCSELs is the same as that depicted in FIGS. 2(a)-(c). Alternatively, each of the VCSELs can also be the one shown in FIGS. 4(a)-(b).

As will be apparent to those skilled in the art, numerous modifications may be made within the scope of the invention, which is not intended to be limited except in accordance with the following claims.

What is claimed is:

1. A vertical cavity surface emitting laser emitting optical radiation at a wavelength, λ, comprising:
   first and second parallel mirrors forming therebetween an optical cavity; and
   an active region disposed between the mirrors, the active region comprising at least one strained semiconductor layer, the strained semiconductor layer having a preferred direction of electrical conductivity substantially along a first direction parallel to the mirrors, and said laser emitting optical radiation having a polarization substantially parallel to this first direction.

2. The laser of claim 1 wherein the active region comprises at least one quantum well, the quantum well comprising a first semiconductor layer interposed between second and third semiconductor layers, the first semiconductor layer having a bulk lattice constant substantially different from the lattice constants of the second and third semiconductor layers, thereby generating a strain in the first semiconductor layer.

3. The laser of claim 2 wherein the first semiconductor layer comprises substantially $In_{(1-x)}Ga_xAs$ where x is a value within the range of $0 \leq x \leq 1$, and the second and third semiconductors comprise substantially GaAs.

4. The laser of claim 3 wherein the first semiconductor comprises substantially $In_{1-x}Ga_xAs$, and has a thickness substantially between the thickness at which dislocations are formed predominantly in one crystal lattice direction and the thickness where such dislocations are formed in a plurality of crystal lattice directions.

5. The laser of claim 1 further comprising a first spacer disposed between the first mirror and the active region, and a second spacer disposed between the active region and the second mirror.

6. The laser of claim 1 further comprising a substrate disposed under the first mirror.

7. The laser of claim 1 wherein the first mirror is a semiconductor distributed Bragg reflector comprising a plurality of alternating semiconductor layers having high and low indices of refraction, each layer having a thickness of $\lambda/4n$ where n is the index of refraction of the layer.

8. A vertical cavity surface emitting laser emitting optical radiation having a wavelength, $\lambda$, comprising:
   first and second parallel mirrors forming therebetween an optical cavity; and
   an elongated active region disposed between the mirrors, the elongated active region having longitudinal and transverse axes oriented in directions substantially perpendicular to the direction of emitted optical radiation, the dimension of the active region along the transverse axis being sufficiently small that the laser emits optical radiation having substantially a fundamental mode along the transverse axis and the optical radiation having a direction of polarization substantially parallel to the longitudinal axis.

9. The laser of claim 8 further comprising an implanted current confinement region extending laterally from the periphery of the active region.

10. The laser of claim 8 further comprising a plurality of implantation regions distributed along the periphery of the active region and symmetric to the longitudinal and transverse axes.

11. The laser of claim 8 further comprising a contact layer formed on the second mirror, the contact layer having a cross-shaped aperture vertically and symmetrically aligned to the active region, said contact layer overlapping the active region at four locations symmetric to the longitudinal and transverse axes.

12. The laser of claim 8 further comprising two etched vertical side walls formed at opposite ends of the longitudinal axis of the active region.

13. The laser of claim 8 wherein the dimension of the active region along the transverse axis is no greater than 6 $\mu$m.

14. The laser of claim 8 wherein the dimension of the active region along the longitudinal axis is approximately 20 $\mu$m.

15. A vertical cavity surface emitting laser array comprising:
   a plurality of vertical cavity surface emitting lasers integrally formed on a substrate, each of the lasers having an elongated active region, each elongated active region having longitudinal and transverse axes oriented in directions substantially perpendicular to the direction in which the laser emits optical radiation, the dimension of each active region along the transverse axis being sufficiently small that each laser emits optical radiation having substantially a fundamental mode along the transverse axis, and the optical radiation from each laser having a direction of polarization substantially parallel to the longitudinal axis of the active region of the laser.

16. The laser array of claim 15 wherein the elongated active region of each laser of the array is formed parallel to the elongated active regions of the other lasers of the array and the direction of polarization of the optical radiation from each laser is parallel.

17. The array of claim 15 wherein adjacent lasers of the array have elongated active regions perpendicular to each other such that each laser emits optical radiation having a direction of polarization that is perpendicular to the direction of polarization of the optical radiation from any adjacent laser(s).

18. The array of claim 15 wherein the dimension of each active region along the transverse axis is no greater than 6 $\mu$m.

19. The array of claim 15 wherein the dimension of each active region along the longitudinal axis is approximately 20 $\mu$m.

* * * * *